United States Patent [19]
Chapman et al.

[11] Patent Number: 6,158,647
[45] Date of Patent: Dec. 12, 2000

[54] CONCAVE FACE WIRE BOND CAPILLARY

[75] Inventors: Gregory M. Chapman, Meridian; Michael J. Bettinger, Eagle; Jennifer A. Due, Meridian, all of Id.

[73] Assignee: Micron Technology, Inc., Boise, Id.

[21] Appl. No.: 09/162,649

[22] Filed: Sep. 29, 1998

[51] Int. Cl.[7] .......................... B23K 37/00; B23K 31/00
[52] U.S. Cl. ..................... 228/180.5; 228/4.5; 228/904
[58] Field of Search ................ 228/180.5, 904, 228/4.5

[56] References Cited

U.S. PATENT DOCUMENTS

| | | | |
|---|---|---|---|
| 3,087,239 | 4/1963 | Clagett | 228/180.5 |
| 3,643,321 | 2/1972 | Field et al. | 228/180.5 |
| 4,030,657 | 6/1977 | Scheffer | 228/1.1 |
| 4,327,860 | 5/1982 | Kirshenboin et al. | 228/179 |
| 4,415,115 | 11/1983 | James | 228/170 |
| 4,434,347 | 2/1984 | Kurtz et al. | 219/56.22 |
| 4,513,190 | 4/1985 | Ellett et al. | 219/56.21 |
| 4,778,097 | 10/1988 | Hauser | 228/44.7 |
| 4,886,200 | 12/1989 | Tsumura | 228/1.1 |
| 4,974,767 | 12/1990 | Alfaro et al. | 228/44.7 |
| 5,003,373 | 3/1991 | Tsumura et al. | 257/771 |
| 5,148,959 | 9/1992 | Cain et al. | 228/4.5 |
| 5,172,851 | 12/1992 | Matsushita et al. | 228/180.22 |
| 5,217,154 | 6/1993 | Elwood et al. | 228/4.5 |
| 5,302,550 | 4/1994 | Hirota et al. | 437/194 |
| 5,421,503 | 6/1995 | Perlberg et al. | 228/4.5 |
| 5,437,405 | 8/1995 | Asanasavest | 228/180.5 |
| 5,445,306 | 8/1995 | Huddleston | 228/1.1 |
| 5,465,899 | 11/1995 | Quick et al. | 228/180.5 |
| 5,485,949 | 1/1996 | Tomura et al. | 228/180.5 |
| 5,516,029 | 5/1996 | Grasso et al. | 228/180.5 |
| 5,544,804 | 8/1996 | Test et al. | 228/180.5 |
| 5,558,270 | 9/1996 | Nachon et al. | 228/180.5 |
| 5,603,445 | 2/1997 | Hill et al. | 228/4.5 |
| 5,662,261 | 9/1997 | Fogal | 228/4.5 |
| 5,871,141 | 2/1999 | Hadar et al. | 228/180.5 |
| 5,884,830 | 3/1999 | Yamazaki et al. | 228/1.1 |
| 5,891,796 | 4/1999 | Nakamura et al. | 438/617 |
| 6,041,995 | 3/2000 | Takahashi et al. | 228/164 |

*Primary Examiner*—Patrick Ryan
*Assistant Examiner*—Lynne Edmondson
*Attorney, Agent, or Firm*—Trask, Britt

[57] ABSTRACT

An improved wire bonding capillary used in the bonding of wires to the bond pads of a semiconductor device and the leads of a lead frame. The wire bonding capillary having a working tip having a working surface including a flat annular portion surrounding the wire feed aperture in the capillary and a concave surface extending therefrom to the intersection with the radius extending from the external tip diameter of the working tip.

7 Claims, 6 Drawing Sheets

2

CONCAVE FACE WIRE BOND CAPILLARY

FIELD OF THE INVENTION

The invention relates to semiconductor manufacturing. More particularly, the invention relates to an improved wire bonding capillary used in the bonding of wires to the bond pads of a semiconductor device and the leads of a lead frame.

BACKGROUND OF THE INVENTION

In semiconductor device manufacturing, a wire bonding process is used to electrically connect the metal bond pads on the active surface of a semiconductor die to the leads or lead fingers of a lead frame. Wire bonding devices are well known in the art. U.S. Pat. Nos. 3,894,671, 4,877,173, and 5,082,154 illustrate wire bonding devices.

The wire bonding process occurs during the final stages of manufacture of the semiconductor device before the semiconductor device is enclosed within a sealed or encapsulated package. Although a variety of different packaging systems are used, most packaging systems include a lead frame on which the semiconductor die is mounted. The lead frame having lead fingers which are connected to the bond pads on the active surface of the semiconductor die through the use of wires bonded to the lead fingers and bond pads. Subsequently, the semiconductor die, wires, and portions of the lead fingers and lead frame are encapsulated in plastic during a molding process. After the molding process, the portions of the lead fingers extending beyond the molded plastic material are trimmed and formed into the desired configuration for the use and mounting of the semiconductor device on a substrate.

The wires used to connect the bond pads of the semiconductor die to the lead fingers of the lead frame are small in diameter, have as short a length as possible, and are typically of gold. During the wire bonding process, a heat block heats the semiconductor die and the lead frame to a temperature in the range of 150° C. to 350° C. A bonding capillary tool mechanically presses the wire against a bond pad on the active surface of the semiconductor die and then to a bonding site on the desired lead finger of the lead frame. The bond wire is threaded through the bonding capillary for use in the bonding process. The end of the wire threaded through the bonding capillary is then heated by an electrical discharge or a hydrogen torch to a molten state thereby forming a ball of molten material on the end of the bond wire extending from the bonding capillary. The molten ball is pressed by the bonding capillary against the heat bond pad on the active surface of the semiconductor die to alloy the metallic elements of the wire and the bond pad thereby bonding the wire to the bond pad in a ball type wire bond. In some instances, ultrasonic vibration of the bonding capillary may be used during the bonding process. After the bonding of the wire to the bond pad on the active surface of a semiconductor die, the bonding capillary tool in moved to a bonding site on the desired lead finger of the lead frame. The wire is pressed against the heated lead finger of the lead frame to bond the wire to the lead finger. The bond wire is then tensioned by the bonding capillary until the wire is sheared making a stitch or wedge type wire bond on the lead finger. The bonding process is repeated for the desired bond pads on the active surface of the semiconductor die for connections to the desired lead fingers of the lead frame.

One type of wire bonding capillary design is illustrated in U.S. Pat. No. 4,415,115. The bonding capillary tip is formed having a flat bonding surface and an annular cutting ridge raised from the flat bond surface surrounding the aperture through which the wire is fed in the bonding capillary. Alternately, the cutting ridge may comprise a semicircle shape rather than an annular shape.

Another type of wire bonding capillary is illustrated in U.S. Pat. No. 5,421,503. The bonding capillary is for use in automatic gold ball bonders for bonding fine gold wires onto closely spaced bond pads on semiconductor devices. The bonding capillary comprises a cylindrical body portion which fits into an ultrasonic transducer having a bottle-neck working tip on the other end of the body portion. The working tip includes a working face comprising an annular ring between the chamfer diameter of the working tip and the working tip diameter and a face angle of approximately 22 degrees plus or minus 3 degrees.

Yet another wire bonding capillary is illustrated in U.S. Pat. No. 5,662,261. The wire bonding capillary includes a working tip having an elongated hole therethrough and a face extending away from the hole at multiple angles of increasing magnitude.

While the size of semiconductor devices continues to decrease and the number of bond pads on the active surface continues to increase having smaller pitch between adjacent bond pads and the width of lead fingers of leadframes decreases, it is necessary to have a wire bonding capillary which will form effective ball type wire bonds on the bond pads of the semiconductor device and stitch or wedge type wire bonds on the lead fingers of the lead frame having acceptable pull-off strength characteristics without damaging the circuitry of the semiconductor device. Such requirements illustrate the need for a wire bonding capillary which will effectively make a ball type wire bond on the bond pad of the semiconductor device without contacting the surface of the semiconductor device adjacent thereto and will effectively make stitch or wedge type wire bonds on the lead fingers of lead frames.

SUMMARY OF THE INVENTION

The present invention relates to an improved wire bonding capillary used in the bonding of wires to the bond pads of a semiconductor device and the leads of a lead frame. The wire bonding capillary having a working tip having a working surface including a flat annular portion surrounding the wire feed aperture in the capillary and a concave surface extending therefrom to the intersection with the radius extending from the external tip diameter of the working tip.

DESCRIPTION OF THE INVENTION

Figure 1:
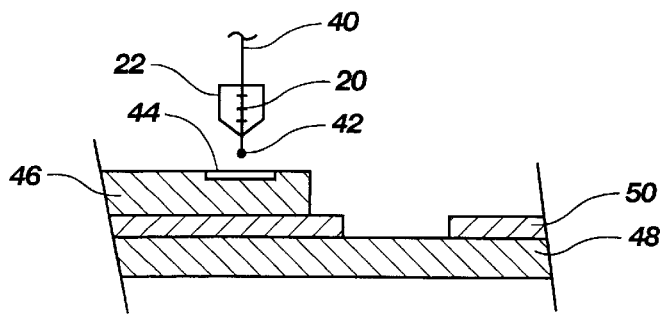
FIGS. 1 through 4 are cross-sectional views showing the steps of a typical wire bonding operation.
Figure 2:
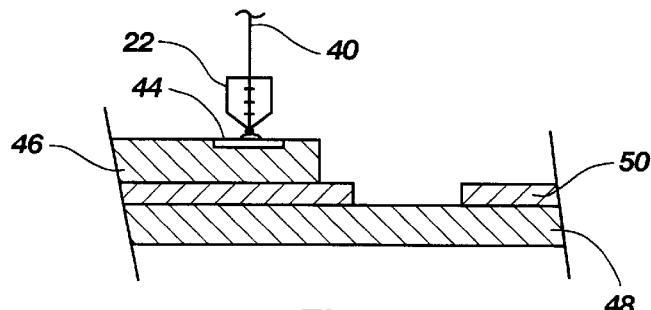
Figure 3:
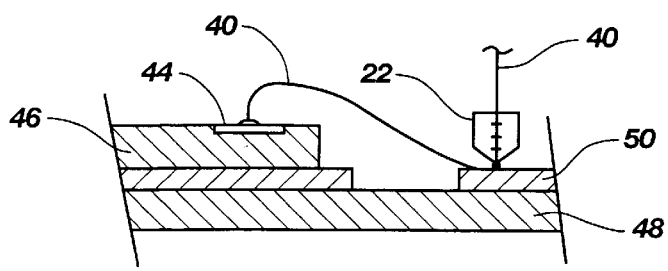

Referring to drawing FIGS. 1 through 4 a typical wire bonding operation using a capillary is illustrated. A wire 40, typically of gold or copper, is threaded through a hole 20 in the capillary tip 22. The end of wire 40 is heated by an electrical discharge or a hydrogen torch to a molten state thereby forming a ball 42 of molten metal on the end of wire 40. Capillary tip 22 is lowered toward bond pad 44 on the active surface of a semiconductor device 46. The bond pad 44 is typically of aluminum or has an aluminum layer thereon. However, the bond pad may be of any suitable conductive metal. A die 46 is heated to a temperature of 150° C. to 350° C. by a heat block 48. Molten ball 42 is pressed by the capillary tip 22 against the heat bond pad 44 to alloy the metallic elements of the wire 40 and bond pad 44 thereby bonding the wire 40 to the bond pad 44. In some instances, ultrasonic vibrations are applied to the capillary tip 22 as the molten ball 42 on the end of wire 40 is pressed against the bond pad 44.

Figure 4:
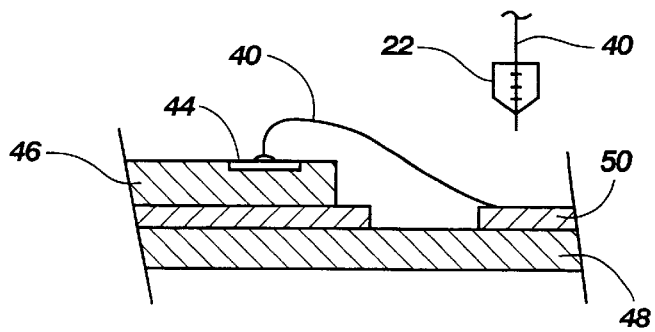

Referring specifically to drawing FIG. 4, capillary tip 22 is then raised causing the wire 40 to feed through the aperture in the capillary tip 22 and moved to a bonding site on a lead finger 50 of a lead frame. The lead finger 50 is heated to a temperature of 150° C. to 350° C. by heated block 48. The wire 40 is pressed against the heated lead finger 50 to alloy the metallic elements of wire 40 and lead finger 50 thereby bonding the wire 40 to the lead finger 50. If desired, ultrasonic vibrations may be applied to the capillary tip 22 as wire 40 is pressed against lead finger 50. The face of the bonding tip 22 severs the wire 40 to form a stitch type wire bond of the wire 40 to the lead finger 50 thereby allowing the bonding tip 22 to be used to repeat the process with respect to other bond pads 44 on the active surface of the semiconductor device 46 and lead fingers 50 of the lead frame depending upon the uniformity of the thickness of the coatings 49 and/or 47 on the semiconductor device 46.

Figure 5:
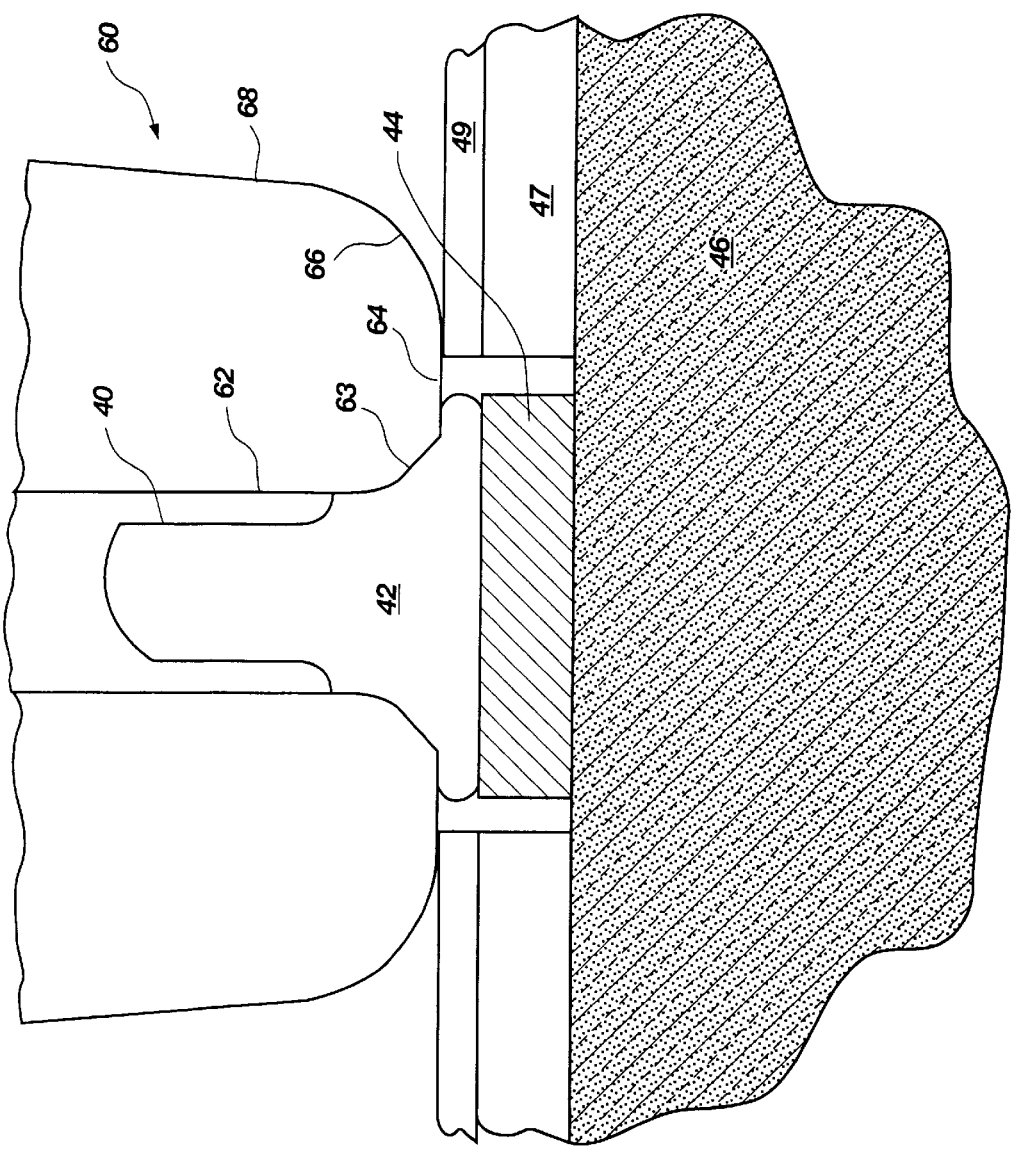
FIG. 5 is a cross-sectional view of a prior art working tip of a wire bonding capillary having a flat surface thereon.

Referring to drawing FIG. 5, the tip portion of a prior art wire bonding capillary 60 is illustrated forming a ball type wire bond 42 on the bond pad 44 of a semiconductor device 46 having a first coating 47 thereon and a second coating 49 over the first coating 47. The tip portion of the bonding capillary 60 includes a central aperture 62 having a frusto-conical surface 63 at the lower end, a flat annular surface 64 extending from the frusto-conical surface 63 to an annular curved surface 66 which terminates in the outer surface 68 of the tip. The frusto-conical surface 63 and flat annular surface 64 help to form the required wire bonds to the bond pad 44 and lead finger (not shown) of a lead frame. However, the flat annular surface 64 may contact the second coating 49 on the semiconductor device 46 during the bonding of the ball 42 of the wire 40 to the bond pad 44 causing damage to the semiconductor device 46.

Figure 6:
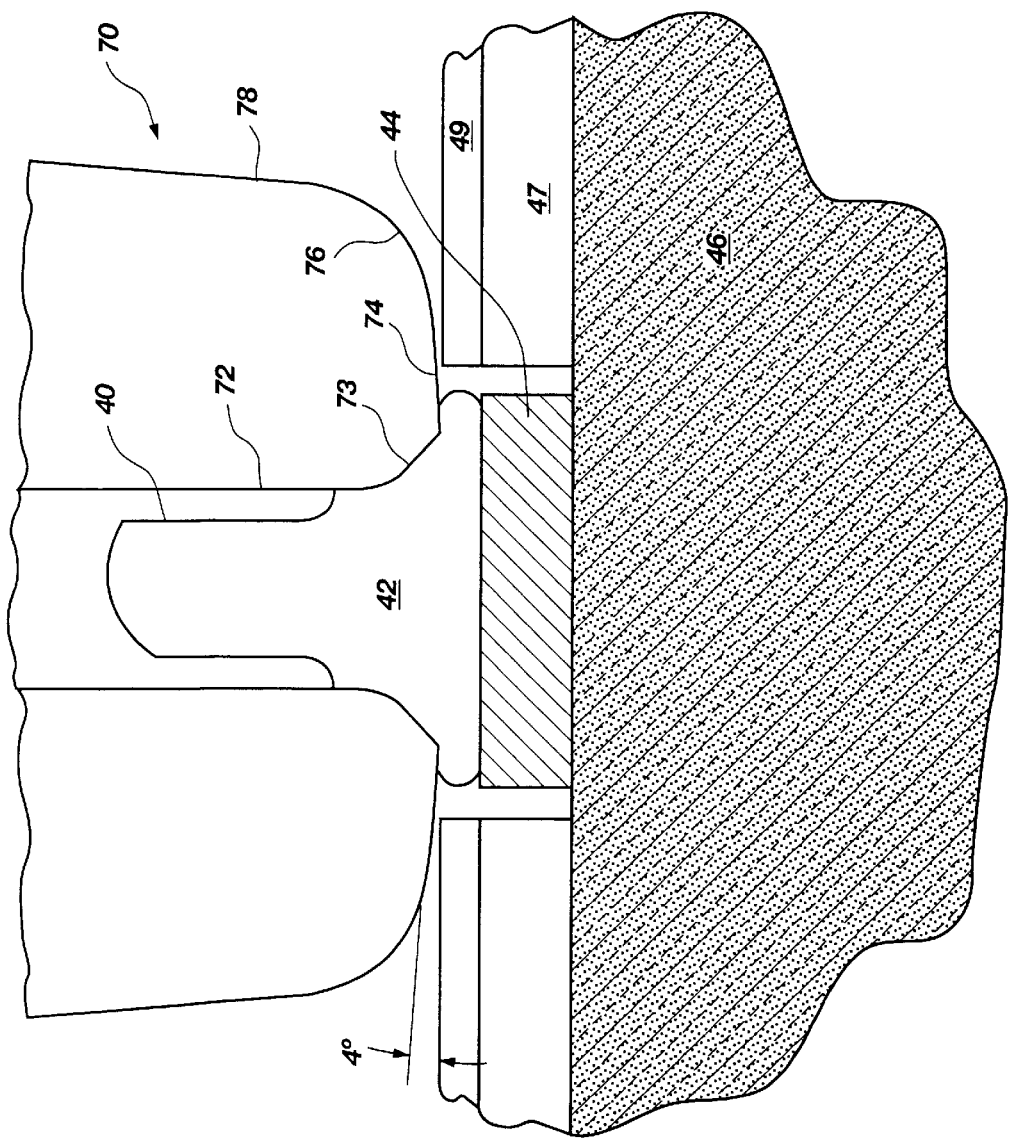
FIG. 6 is a cross-sectional view of a prior art working tip of a wire bonding capillary having an angled surface thereon.

Referring to drawing FIG. 6, the tip portion of a prior art wire bonding capillary 70 is illustrated forming a ball type wire bond 42 on the bond pad 44 of a semiconductor device 46 having a first coating 47 thereon and a second coating 49 over the first coating 47. The tip portion of the bonding capillary 70 includes a central aperture 72 having a first frusto-conical surface 73 at the lower end of the central aperture 72, a second frusto-conical surface 74 extending from the first frusto-conical surface 73 to an annular curved surface 76 which terminates in the outer surface 78 of the tip. The first frusto-conical surface 73 and second frusto-conical surface 74 help to form the required wire bonds to the bond pad 44 and lead finger (not shown) of a lead frame. The second frusto-conical surface 74 being formed generally at an angle of four degrees (4°) with respect to a horizontal plane extending through the upper surface of the second coating 49 on the semiconductor device 46. However, the second frusto-conical surface 74 may contact the second coating 49 on the semiconductor device 46 during the bonding of the molten metal ball 42 of the wire 40 to the bond pad 44 causing damage to the semiconductor device 46 depending upon the uniformity of thickness of the coating 49 and/or 47 on the semiconductor device 46.

Figure 7:
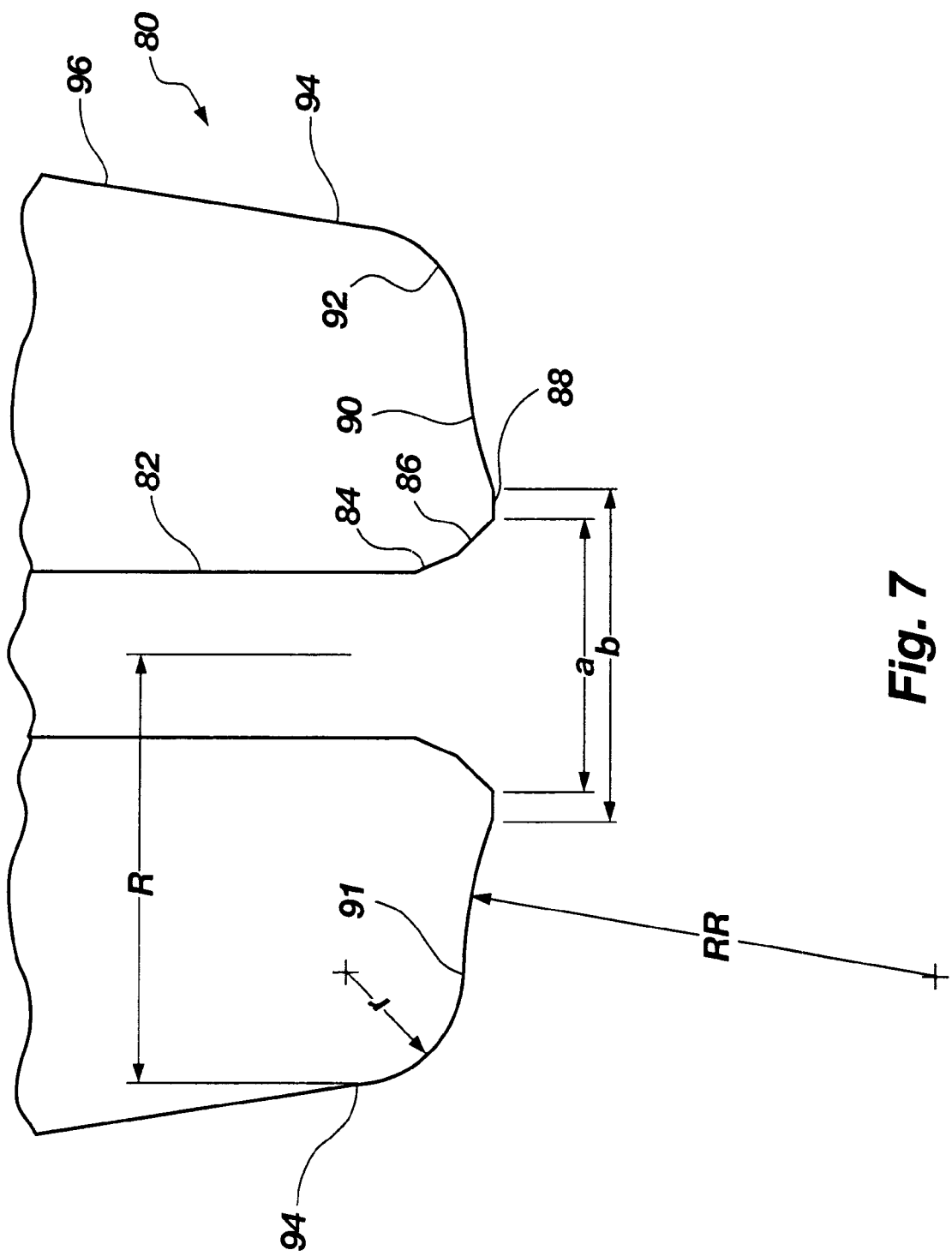
FIG. 7 is a cross-sectional view of the working tip of the wire bonding capillary of the present invention.

Referring to drawing FIG. 7, the tip of a wire bonding capillary 80 of the present invention is illustrated. The tip portion of the bonding capillary 80 includes a central aperture 82 having a first frusto-conical surface 84 and second frusto-conical surface 86 extending from the lower end of the first frusto-conical surface 84, both located at or near the lower end of the aperture 82, and, on the lower surface of the tip, a flat annular surface 88 extending for a distance between diameter "a" to diameter "b" of the tip from the second frusto-conical surface 86 of the aperture 82 and a face having an annular concave surface 90 extending from the diameter b of the flat annular surface 88 into the tip and outwardly a distance to a point of inflection (tangency) 91 to an annular curved surface 92 defined by a radius "r" of curvature of the tip, which, in turn, intersects at point 94, the lower annular radial diameter "R" of the wire bonding capillary, with the annular conical outer surface 96 of the tip. A radius of curvature "RR" is used for the formation of the annular concave surface 90, the size of the radius "RR" determining the degree of curvature of the annular concave surface 90 for the relative clearance between the capillary tip 80 and a coating 49 on the surface of the semiconductor device 46. The first frusto-conical surface 84 and second frustoconical surface 86 of the aperture 82 and the flat annular surface 88 help to form the required wire bonds to the bond pad 44 and lead finger (not shown) of a lead frame. The flat annular surface 88 of the lower surface of the tip being used to sever the wire 40 during the formation of a stitch or wedge type wire bond on the lead finger (not shown) of a lead frame during the wire bonding process. The width of the flat annular surface 88 being determined by the size of the bond pad of the semiconductor device upon which the wire bonding capillary 80 is to be used.

Figure 8:
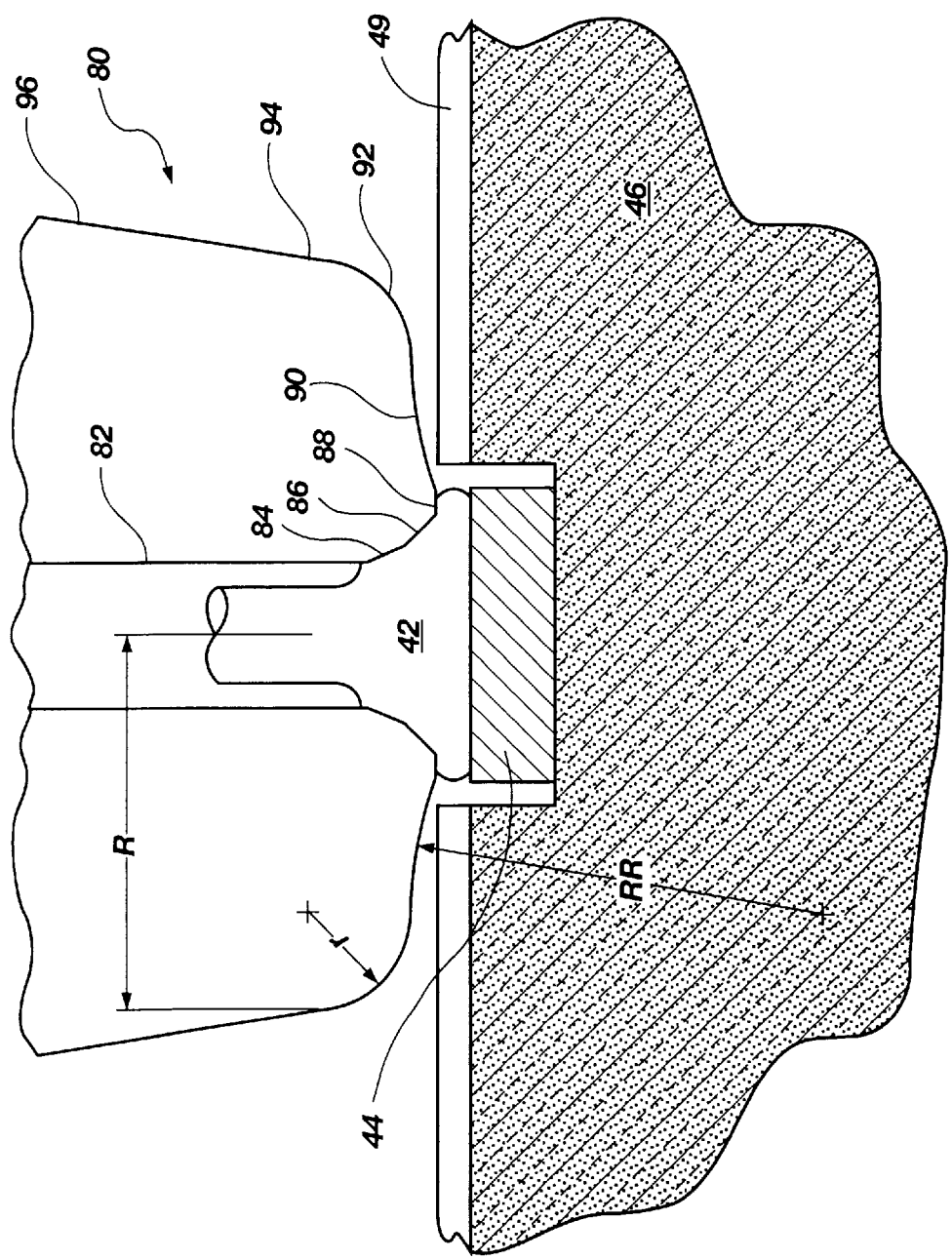
FIG. 8 is a cross-sectional view of the working tip of the wire bonding capillary of the present invention making a ball type wire bond on a bond pad of a semiconductor device.

Referring to drawing FIG. 8, the tip of a wire bonding capillary 80 of the present invention is illustrated in relation to a semiconductor device 46 having a second coating 49 and a bond pad 44 on the active surface thereof. The first frusto-conical surface 84, second frusto-conical surface 86, and flat annular surface 88 forming the ball-type wire bond 42 with the bond pad 44. The annular concave surface 90 providing clearance with the second coating 49 on the active surface of the semiconductor device 46 to prevent contact of the tip of the wire bonding capillary 80.

Figure 9:
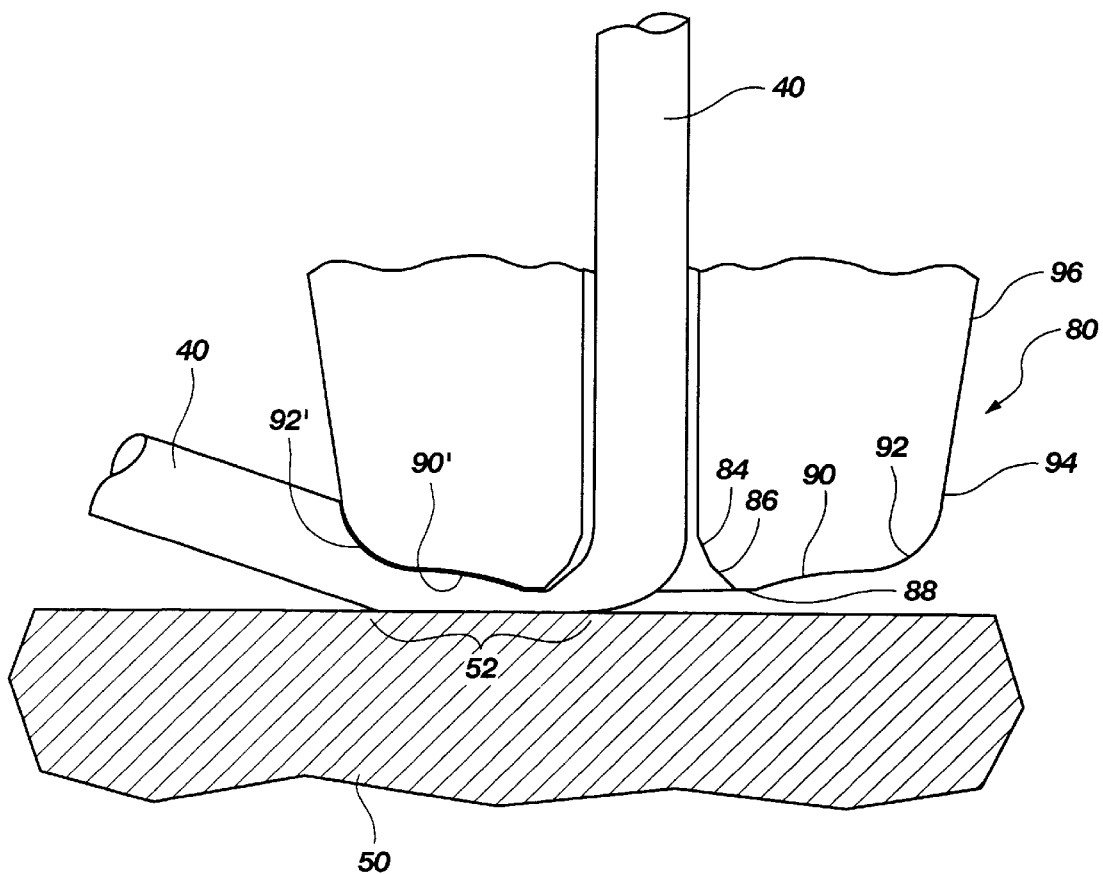
FIG. 9 is a cross-sectional view of the working tip of the wire bonding capillary of the present invention making a stitch or wedge type bond on a lead finger of a leadframe.

Referring to drawing FIG. 9, the wire bonding capillary 80 of the present invention is illustrated in conjunction with a lead finger 50 of a lead frame. The wire 40 is bonded in the bond area 52 of the lead finger 50 by the wire bonding capillary 80 with the flat annular surface 88, annular concave surface 90, and annular curved surface 92 of the tip deforming the wire 40 into engagement with a portion of the lead finger 50. The flat annular surface 88 of the wire bonding capillary 80 being used to sever the wire 40 after the bonding thereof to the lead finger 50. The annular concaved surface 90 and annular curved surface 92 of the wire bonding capillary being used in conjunction with the annular flat surface 88 thereof to form the bond area 52 of the connection of the wire 40 to the lead finger 50, the bond area 52 having a convex portion 90' which is formed by surface 92 of the tip 80 and a curved portion 92' which is formed by the annular curved surface 92 of the tip 80. The annular flat surface 88, annular concaved surface 90, and curved annular surface 92 providing a gradual transition between the wedge deformity of the wire 40 and the existing circular shape of the wire 40 extending beyond the bond area 52. The wire 40 being heated by suitable means before the formation of the stitch or wedge type bond on the lead finger 50 while the lead finger is heated before the formation of the wire bond thereto.

From the foregoing, it is apparent that changes, modifications, and deletions may be made to the capillary bonding tool of the present invention which fall within the scope of the invention. For instance, the varying the length or size of the radii "r", "R", or "RR" and the radial dimensions of the annular area 88 between the dimensions "a" and "b".

What is claimed is:

1. A wire bonding capillary comprising:
    a wire bonding capillary tool including:
        a capillary tip having an elongated hole therethrough, the elongated hole terminating at one end of the capillary tip and
        a face on the one end of the capillary tip, the face including a first frusto-conical surface extending from a portion of the elongated hole of the capillary tip, a second frusto-conical surface having a portion thereof connected to the first frusto-conical surface, a substantially horizontal annular surface having a portion connected to the second frusto-conical surface, wherein said substantially horizontal annular surface is defined by the radius of curvature of the capillary tip and a concave surface with a degree of curvature said concave surface extending from a portion of the substantially horizontal annular surface, wherein the degree of curvature of the concave surface is defined by a radius of curvature and wherein the degree of curvature of the concave surface provides for relative clearance of the capillary tip from adjacent components.

2. The wire bonding capillary of claim 1, further comprising:
    an annular curved surface intersecting the concave surface extending from the substantially horizontal annular surface.

3. The wire bonding capillary of claim 2, wherein the substantially horizontal annular curved surface is formed by a radius.

4. The wire bonding capillary of claim 4, wherein the substantially horizontal annular curved surface intersects an outer diameter of the capillary tip of the wire bonding capillary tool.

5. The wire bonding capillary of claim 1, wherein the capillary tip includes an annular conical surface extending from an outer diameter of the face of the capillary tip.

6. A method of forming a wire bond on a bond pad of a semiconductor device having an active surface thereon having at least one bond pad thereon, said method comprising:
    providing a wire bonding capillary including:
        a capillary tip having an elongated hole therethrough, the hole terminating at one end of the elongated capillary tip; and
        a face on the one end of the capillary tip, the face including a first frusto-conical surface extending from a portion of the elongated hole of the capillary tip, a second frusto-conical surface having a portion thereof connected to the first frusto-conical surface, a substantially horizontal annular surface having a portion connected to the second frusto-conical surface, and a concave surface having a portion extending from the substantially horizontal annular surface;
    extending a wire through the hole in the capillary tip;
    heating a portion of the elongated wire to form a mass on an end thereof,
    contacting said at least one bond pad on said active surface of said semiconductor device with the mass on the end of the wire; and
    securing the mass on the end of the wire to said at least one bond pad on said active surface of said semiconductor device, forming a wire bond thereon having a substantially horizontal annular surface thereon without contacting said active surface of said semiconductor device, said mass on the end of the wire including a first frusto-conical portion adjacent the wire, a second frusto-conical portion connected to the first frusto-conical portion, and a substantially horizontal annular portion connected to the second frusto-conical portion.

7. A method of forming a wire bond on a lead finger of a lead frame, said method comprising:
    providing a wire bonding capillary including:
        a capillary tip having an elongated hole therethrough, the hole terminating at one end of the elongated capillary tip;
        a face on an end of the capillary tip, the face including a first frusto-conical surface extending from a portion of the elongated hole of the capillary tip, a second frusto-conical surface having a portion thereof connected to the first frusto-conical surface, a substantially horizontal annular surface having a portion connected to the second frusto-conical surface, and having a concave surface extending from the substantially horizontal annular surface;
    extending a wire through the hole in the capillary tip;
    heating a portion of the elongated wire,
    contacting said lead finger of said lead frame with the heated portion of the wire; and
    securing the wire to said lead finger, forming a wire bond thereon having a curved convex surface on a portion thereof formed by at least a portion of the concave surface of the face of the capillary tip.

* * * * *

UNITED STATES PATENT AND TRADEMARK OFFICE
CERTIFICATE OF CORRECTION

PATENT NO. : 6,158,647
DATED : December 12, 2000
INVENTOR(S) : Gregory M. Chapman, Michael J. Bettinger and Jennifer A. Due It is certified that error appears in the above-identified patent and that said Letters Patent is hereby corrected as shown below:

Title page,
Item [57], ABSTRACT,
Line 3, change "frame. The" to -- frame, the --

Column 1,
Line 49, change "heat" to -- heated --

Column 2,
Line 23, change "leadframes" to -- lead frames --
Line 65, before "DESCRIPTION" insert -- DETAILED --

Column 3,
Line 9, change "A die" to -- The semiconductor device --
Line 11, before "bond" change "heat" to -- heated --
Lines 27 and 29, change "bonding" to -- capillary --
Line 33, after ""47" insert -- (FIG. 5) --
Line 41, after "end" and before the comma insert -- of the aperture --
Line 64, change "being" to -- is --

Column 4,
Line 27, change "capillary tip" to -- tip of the capillary --
Lines 34, 37 and 58, change "being" to -- is --
Line 45, change "forming" to -- form --
Line 46, change "44. The" to -- 44, the --
Lines 59 and 67, change "concaved" to -- concave --
Line 61, change "being" to -- are --
Line 64, change "surface 92" to -- annular concave surface 90 -- and after "tip" insert -- of capillary --
Line 66, after "tip" insert -- of capillary --

Column 5,
Line 1, change "providing" to -- proved --
Line 3, change "52. The" to -- 52, the --
Line 11, change the period after "invention" to a comma and change "For" to -- for --
Line 11, after "instance" delete "the"
Line 30, insert a comma after "tip"
Line 31, insert a comma after "curvature"

UNITED STATES PATENT AND TRADEMARK OFFICE
CERTIFICATE OF CORRECTION

PATENT NO. : 6,158,647
DATED : December 12, 2000
INVENTOR(S) : Gregory M. Chapman, Michael J. Bettinger and Jennifer A. Due It is certified that error appears in the above-identified patent and that said Letters Patent is hereby corrected as shown below:

Column 6,
Lines 3 and 36, before "hole" insert -- elongated -- and at the end of the line delete "elongated"
Lines 15 and 47, before "hole" insert -- elongated --
Lines 16 and 48, delete "elongated"

Signed and Sealed this

Seventeenth Day of June, 2003

JAMES E. ROGAN
*Director of the United States Patent and Trademark Office*